(12) United States Patent
Lee

(10) Patent No.: US 10,541,181 B2
(45) Date of Patent: Jan. 21, 2020

(54) WAFER AND WAFER DEFECT ANALYSIS METHOD

(71) Applicant: SK SILTRON CO., LTD., Gumi-si, Gyeongsangbuk-do (KR)

(72) Inventor: Jae Hyeong Lee, Gumi-si (KR)

(73) Assignee: SK SILTRON CO., LTD., Gum-si, Gyeongsangbuk-Do (KR)

( * ) Notice: Subject to any disclaimer, the term of this patent is extended or adjusted under 35 U.S.C. 154(b) by 0 days.

(21) Appl. No.: 16/401,417

(22) Filed: May 2, 2019

(65) Prior Publication Data

US 2019/0267294 A1     Aug. 29, 2019

Related U.S. Application Data

(63) Continuation of application No. 15/740,332, filed as application No. PCT/KR2016/007010 on Jun. 30, 2016, now Pat. No. 10,325,823.

(30) Foreign Application Priority Data

Jul. 1, 2015    (KR) .................... 10-2015-0094243

(51) Int. Cl.
| | | |
|---|---|---|
| *H01L 29/30* | (2006.01) | |
| *H01L 21/66* | (2006.01) | |
| *H01L 29/32* | (2006.01) | |
| *H01L 21/324* | (2006.01) | |

(52) U.S. Cl.
CPC ............ *H01L 22/12* (2013.01); *H01L 21/324* (2013.01); *H01L 22/20* (2013.01); *H01L 22/24* (2013.01); *H01L 29/32* (2013.01)

(58) Field of Classification Search
CPC ....... H01L 21/324; H01L 29/32; H01L 22/10; H01L 22/12; H01L 22/24

USPC ........................................................ 257/617
See application file for complete search history.

(56) References Cited

U.S. PATENT DOCUMENTS

| | | |
|---|---|---|
| 2010/0290971 A1 | 11/2010 | Itou et al. |
| 2013/0045583 A1 | 2/2013 | Reynaud et al. |
| 2014/0361408 A1 | 12/2014 | Falster et al. |

FOREIGN PATENT DOCUMENTS

| | | |
|---|---|---|
| JP | H 08-111444 | 4/1996 |
| JP | 2005-029467 | 2/2005 |
| JP | 4203629 | 1/2009 |
| JP | 4699675 | 6/2011 |
| KR | 10-2001-0078701 | 8/2001 |
| KR | 10-2003-0040952 | 5/2003 |
| KR | 10-2010-0123603 | 11/2010 |

(Continued)

OTHER PUBLICATIONS

International Search Report (with English Translation) and Written Opinion dated Oct. 10, 2016 issued in Application No. PCT/KR2016/007010.

(Continued)

*Primary Examiner* — David S Blum
(74) *Attorney, Agent, or Firm* — KED & Associates, LLP

(57) ABSTRACT

A wafer defect analysis method according to one embodiment comprises the steps of: thermally treating a wafer at different temperatures; measuring an oxygen precipitate index of the thermally treated wafer; determining a characteristic temperature at which the oxygen precipitate index is maximized; and discriminating a type of defect region of the wafer depending on the determined characteristic temperature.

11 Claims, 7 Drawing Sheets

(56) References Cited

FOREIGN PATENT DOCUMENTS

WO     WO 2014/189194     11/2014

OTHER PUBLICATIONS

Korean Office Action dated Dec. 21, 2016 issued in Application No. 10-2015-0094243.
Japanese Office Action dated Jan. 21, 2019 issued in Application No. 2017-567129.
Restriction Requirement dated Nov. 2, 2018 issued in U.S. Appl. No. 15/740,332.

WAFER AND WAFER DEFECT ANALYSIS METHOD

This application is a continuation of U.S. patent application Ser. No. 15/740,332, now U.S. Pat. No. 10,325,823, filed Dec. 27, 2017, which is a U.S. National Stage Application under 35 U.S.C. § 371 of PCT Application No. PCT/KR2016/007010, filed Jun. 30, 2016, which claims priority to Korean Patent Application No. 10-2015-0094243, filed Jul. 1, 2015, whose entire disclosures are hereby incorporated by reference.

TECHNICAL FIELD

Embodiments relate to a wafer and a wafer defect analysis method.

BACKGROUND ART

In general, as methods for manufacturing silicon wafers, a Floating Zone (FZ) method or a Czochralski (CZ) method is mainly used. Because growing a monocrystal silicon ingot using the FZ method is plagued by several problems, such as difficulty in manufacturing large-diameter silicon wafers and considerably expensive process costs, growing a monocrystal silicon ingot using the CZ method is prevalent.

With such a CZ method, after polycrystalline silicon is charged into a quartz crucible and is melted by heating a graphite heating element, a seed crystal is submerged into molten liquid silicon, acquired as a result of melting, to cause crystallization at the interface of the molten liquid silicon, and is then pulled while being rotated, thereby completing the growth of a monocrystal silicon ingot. Thereafter, the grown monocrystal silicon ingot is subjected to slicing, etching, and polishing so as to be shaped into a wafer.

A common method of analyzing a defect region of a wafer includes a process of evenly contaminating the surface of a wafer using a metal solution. Thereafter, a defect region is distinguished using a phenomenon in which the degree of gettering of the metal is different per defect regions due to diffusion of point defects within a temperature range capable of achieving oxygen precipitation. This conventional method of analyzing a defect region of a wafer has a merit in that it is possible to visually and clearly distinguish a defect region and in that it is easy to quantify the area of the defect region. However, when the analysis of a defect region of a wafer is performed using this conventional method, equipment for contaminating metal and etching equipment are additionally required and results after heat treatment may vary greatly depending on the contamination concentration and contamination method of the surface of the wafer. Further, when a worker observes a defect region with the naked eye using highlight, an error may occur.

When a Cu contamination method (or a Cu Haze method), which is one of conventional crystal defect evaluation methods, is used, local variation due to a difference in concentration between point defects cannot be excluded, and thus there is a problem in that a defect region cannot be accurately distinguished.

DISCLOSURE

Technical Problem

Embodiments provide a wafer having a defect region that is reliably distinguishable and a wafer defect analysis method capable of reliably distinguishing a defect region of the wafer.

Technical Solution

In one embodiment, a wafer includes defect regions having respectively different characteristic temperatures at which an oxygen precipitation index is maximized, and the defect regions include at least one of a small void region, an O-band region, a vacancy dominant defect-free region, a transition region, or an interstitial dominant defect-free region.

For example, the oxygen precipitation index may include at least one of a change in an amount of oxygen included in the wafer before and after application of heat treatment to the wafer, a density of oxygen precipitates included in the wafer, a generated amount of oxygen precipitate nuclei, or a generation rate of the oxygen precipitate nuclei.

For example, among the defect regions, the characteristic temperature of the small void region may be 870° C. or more, the characteristic temperature of the O-band region may be 840° C. or more and less than 870° C., the characteristic temperature of the vacancy dominant defect-free region may be 810° C. or more and less than 840° C., the characteristic temperature of the transient region may be 800° C. or more and less than 810° C., and the characteristic temperature of the interstitial dominant defect-free region may be less than 800° C.

For example, a void vacancy defect region may be absent from the defect regions.

In another embodiment, a method for determining defect regions of a wafer includes (a) thermally treating the wafer at different temperatures, (b) measuring an oxygen precipitation index of the thermally treated wafer, (c) determining a characteristic temperature at which the oxygen precipitation index is maximized, and (d) discriminating a type of the defect region included in the wafer depending on the determined characteristic temperature.

For example, step (a) may include (a1) generating oxygen precipitate nuclei in each of the defect regions included in the wafer by thermally treating the wafer at a first temperature for a first time period. Step (a) may further include (a2) growing the generated oxygen precipitate nuclei into oxygen precipitates by thermally treating the thermally treated wafer at a second temperature, which is higher than the first temperature, for a second time period.

For example, the first temperature may be 450° C. or more and less than 1000° C. and the first time period may be in the range from 1 hour to 20 hours. The second temperature may have a minimum value of 950° C. and the second time period may be in the range from 1 hour to 20 hours.

For example, step (a2) may be performed until the oxygen precipitates reach an observable size.

For example, the oxygen precipitation index may include at least one of a change between an amount of oxygen included in the wafer before performance of step (a1) and an amount of oxygen included in the wafer after performance of step (a2), a density of the oxygen precipitates, a generated amount of the oxygen precipitate nuclei, or a generation rate of the oxygen precipitate nuclei.

For example, step (b) may be performed in the radial direction of the wafer.

For example, the characteristic temperature determined in step (c) may correspond to a temperature at which the oxygen precipitate nuclei are maximally generated.

For example, in step (c), when it is impossible to determine the characteristic temperature within the range of the first temperature, the characteristic temperature may be determined using a least-square fitting method.

For example, in step (d), when the characteristic temperature is 870° C. or more, the type of the defect regions may be determined to be a small void region, when the characteristic temperature is 840° C. or more and less than 870° C., the type of the defect regions may be determined to be an O-band region, when the characteristic temperature is 810° C. or more and less than 840° C., the type of the defect regions may be determined to be a vacancy dominant defect-free region, when the characteristic temperature is 800° C. or more and less than 810° C., the type of the defect regions may be determined to be a transient region, and when the characteristic temperature is less than 800° C., the type of the defect regions may be determined to be an interstitial dominant defect-free region.

In addition, the wafer defect analysis method may further include determining a concentration of point defects included in the wafer depending on the determined characteristic temperature, and the defect regions may be defined based on distribution of the point defects in the surface of the wafer.

For example, in step (a), the wafer before the application of heat treatment thereto may be a bare wafer.

For example, step (c) may include estimating the characteristic temperature using a change in the amount of oxygen.

For example, a void vacancy defect region may be absent from the type of the defect regions determined in step (d).

For example, when the density of the oxygen precipitates is measured as the oxygen precipitation index, a laser scattering method and an etching method may be used.

Advantageous Effects

According to a wafer and a wafer defect analysis method according to embodiments, it is possible to accurately distinguish a defect region in a wafer based on a characteristic temperature at which an oxygen precipitation index is maximized, thereby eliminating an additional process such as metal contamination and additional equipment required for a conventional wafer defect analysis method and excluding local variation due to a difference in concentration between point defects, and also to minimize the possibility of failure or error in distinguishing the type of defect region, thereby providing a portfolio of wafers.

BEST MODE

Reference will now be made in detail to the preferred embodiments, examples of which are illustrated in the accompanying drawings. However, the embodiments may be variously modified and do not limit the scope of the present disclosure. The embodiments are provided only to more completely describe the present disclosure to those skilled in the art.

Hereinafter, a wafer (or a substrate, or a monocrystal silicon wafer) according to the embodiment will be described as follows. Before the description of the wafer according to the embodiment is made, a distribution of defect regions (or crystal defect regions) according to V/G when a monocrystal silicon ingot is grown will be explained as follows with reference to FIG. 1.

Figure 1:
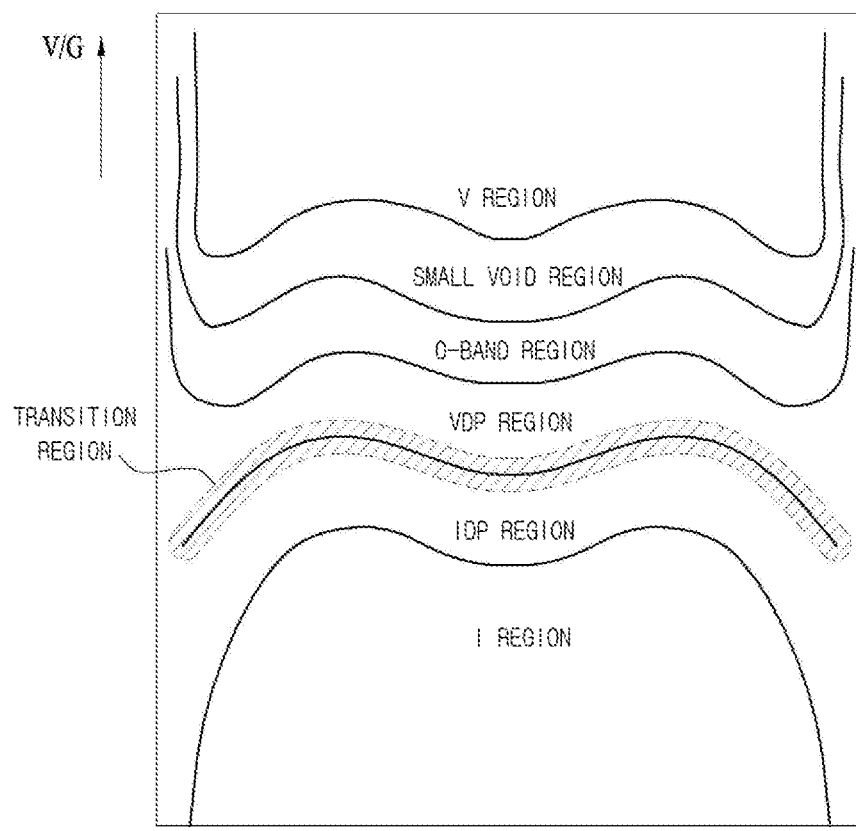
FIG. 1 is a view schematically illustrating a distribution of defect regions according to V/G when a monocrystal silicon ingot is grown.

FIG. 1 is a view schematically illustrating the distribution of defect regions according to V/G when a monocrystal silicon ingot is grown. Here, V represents the pulling velocity of a monocrystal silicon ingot and G represents a vertical temperature gradient around a crystal-melt interface.

According to Voronkov's theory, when a monocrystal silicon ingot is pulled at a high speed under growth conditions in which a V/G value is equal to or exceeds a predetermined critical value, the monocrystal silicon ingot is grown to have a vacancy-rich region (or a void vacancy defect region) (hereinafter referred to as a 'V region') including defects caused by voids. That is, the V region is a defect region with excessive vacancies due to silicon atom shortage.

In addition, when a monocrystal silicon ingot is pulled under growth conditions in which a V/G value is less than the predetermined critical value, the monocrystal silicon ingot is grown to have an O-band region including oxidation induced stacking faults (OSFs).

In addition, when a monocrystal silicon ingot is pulled at a low speed under growth conditions in which a V/G value is further decreased, the monocrystal silicon ingot is grown to have an interstitial region (hereafter referred to as an 'I region') caused by a dislocation loop in which interstitial silicon is gathered. That is, the I region is a defect region characterized by excessive aggregation of interstitial silicon due to a surplus of silicon atoms.

A vacancy dominant defect-free region (hereinafter referred to as a 'VDP region'), in which vacancies are dominant, and an interstitial dominant defect-free region (hereinafter referred to as 'IDP region'), in which interstitials are dominant, are present between the V region and the I region. The VDP region and the IDP region are the same in that there is no silicon atom shortage or surplus, but differ from each other in that the excess vacancy concentration is dominant in the VDP region and the excess interstitial concentration is dominant in the IDP region.

A small void region, which belongs to the O-band region and has fine vacancy defects, for example, direct surface oxide defects (DSODs), may be present.

In addition, a transient region, which spans both the VDP region and the IDP region over the boundary between the VDP region and the IDP region, may be present.

The wafer according to the embodiment does not include the V region among the various defect regions illustrated in FIG. 1. At this time, the wafer according to the embodiment may include a defect region other than the V region, and the defect region may include at least one of the small void region, the O-band region, the VDP region, the transient region, or the IDP region, which are illustrated in FIG. 1.

The defect regions included in the wafer according to the embodiment have respective characteristic temperatures TC. Here, the characteristic temperature TC refers to a temperature at which an oxygen precipitation index is maximized within a heat treatment temperature (hereinafter referred to as a 'first temperature') range for generating oxygen precipitate nuclei in the wafer. The characteristic temperature TC will be described in detail later with reference to FIG. 2. That is, in the wafer according to the embodiment, the characteristic temperature TC of the small void region, the characteristic temperature TC of the O-band region, the characteristic temperature TC of the VDP region, the characteristic temperature TC of the IDP region, and the characteristic temperature TC of the transient region may be different from one another.

For example, the characteristic temperatures TC of the respective defect regions included in the wafer according to the embodiment may have the values shown in the following Table 1.

TABLE 1

| Defect Region | Characteristic Temperature (TC) |
|---|---|
| Small Void Region | 870° C. ≤ TC |
| O-band Region | 840° C. ≤ TC < 870° C. |
| VDP Region | 810° C. ≤ TC < 840° C. |
| Transient Region | 800° C. ≤ TC < 810° C. |
| IDP Region | TC < 800° C. |

In addition, the oxygen precipitation index of the defect region included in the wafer may include at least one of a change in the amount of oxygen (or a difference in concentration of oxygen) ΔOi included in the wafer before and after the application of heat treatment to the wafer, a density of the oxygen precipitates included in the wafer, the generated amount of oxygen precipitate nuclei, or the generation rate of the oxygen precipitate nuclei. A detailed explanation of a change in the amount of oxygen ΔOi will be made later with reference to FIG. 2.

Figure 2:
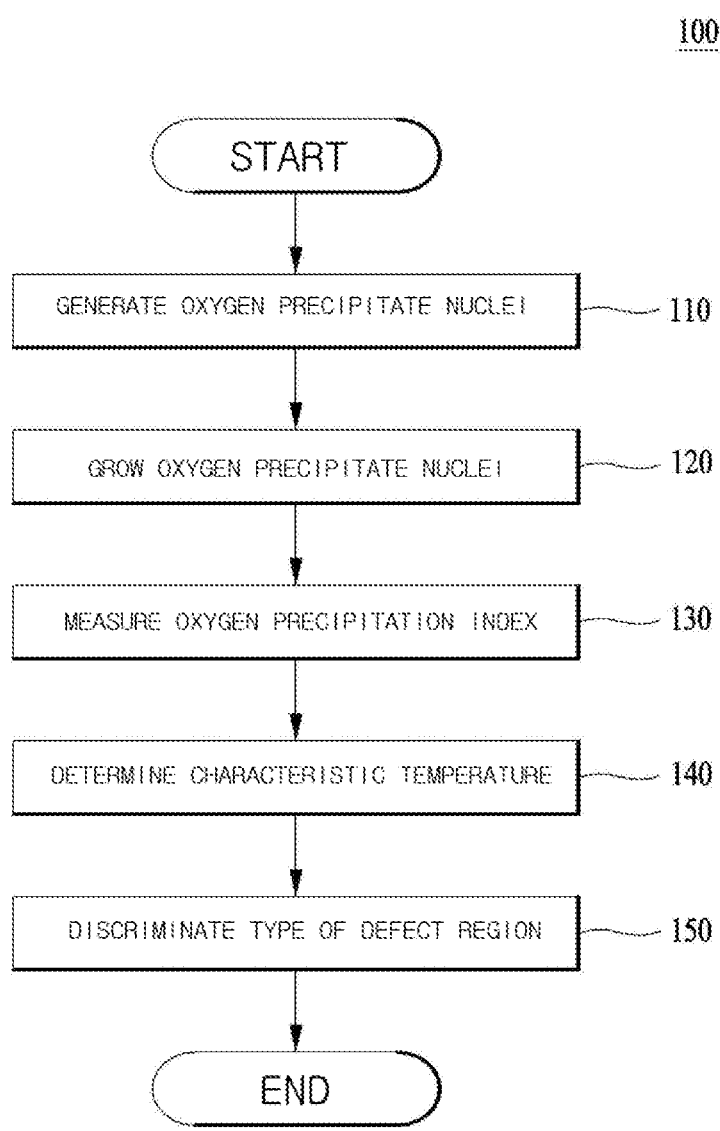
FIG. 2 is a flowchart for explaining a wafer defect analysis method according to an embodiment.

FIG. 2 is a flowchart for explaining a wafer defect analysis method 100 according to the embodiment.

Referring to FIG. 2, according to the wafer defect analysis method 100 according to the embodiment, the wafer may be thermally treated at different temperatures (step 110 and step 120).

Figure 3:
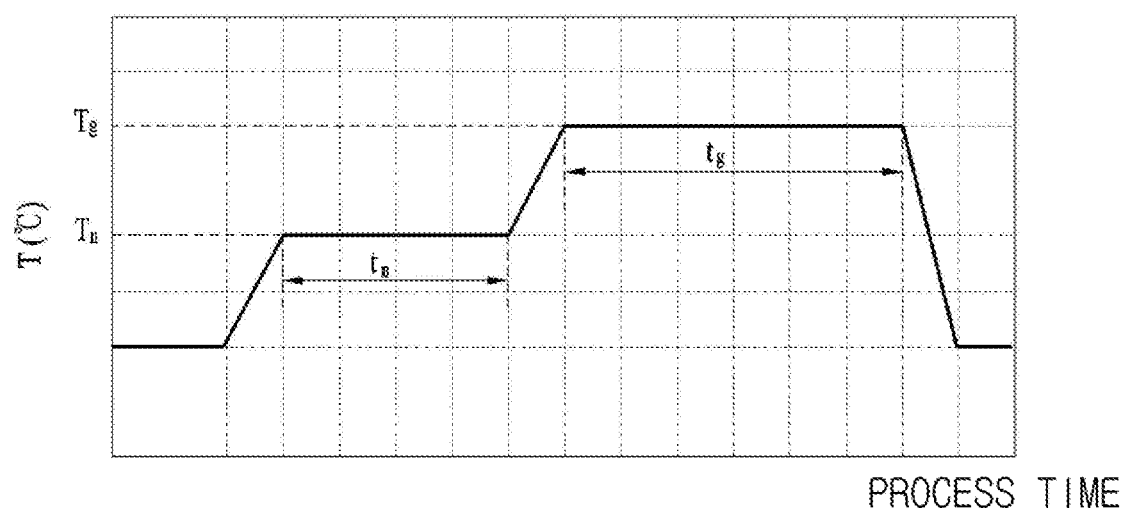
FIG. 3 is a graph for explaining step 110 and step 120 shown in FIG. 2.

FIG. 3 is a graph for explaining step 110 and step 120 shown in FIG. 2, wherein the horizontal axis denotes a process time and the vertical axis denotes a temperature T.

According to the embodiment, the step of thermally treating the wafer may include only step 110. In this case, the wafer may be thermally treated at a first temperature Tn for a first time period tn, thereby generating (or forming) oxygen precipitate nuclei in the respective defect regions included in the wafer (step 110). If the first temperature Tn is less than 450° C., the agglomeration of oxygen atoms may not be active. In addition, if the first temperature Tn is 1000° C. or more, a dissociation process is more active than precipitation, which may be disadvantageous for the induction of oxygen precipitation. That is, if the first temperature Tn is 1000° C. or more, the growth of the oxygen precipitate nuclei may be more dominant than the generation thereof. Considering this, the first temperature Tn may be, for example, 450° C. or more and less than 1000° C.; however, the disclosure is not limited thereto.

In addition, considering the diffusion of oxygen atoms, the first time period tn may be 1 hour or more. Even if the first time period tn is increased to 20 hours or more, the generated amount of oxygen precipitate nuclei may not be large. Therefore, the first time period tn may be in the range from 1 hour to 20 hours, for example, from 1 hour to 16 hours; however, the disclosure is not limited thereto.

In addition, in order to minimize variation in individual wafers, a wafer taken out from the region close to the monocrystal silicon or one piece of wafer may be divided into sections having the same area and may then be thermally treated.

In addition, the wafer that is to be thermally treated in step 110 may be a bare wafer that has not gone through any treatment.

According to another embodiment, the step of thermally treating the wafer may include both step 110 and step 120. In this case, the wafer that was thermally treated in step 110 is thermally treated at a second temperature Tg, which is higher than the first temperature Tn, for a second time period tg, to thereby grow the generated oxygen precipitate nuclei into oxygen precipitates (step 120). For example, the minimum value of the second temperature Tg may be 950° C.; however, the disclosure is not limited thereto.

According to still further embodiment, the first temperature Tn may be in the range, for example, from 450° C. to 1100° C., and the minimum value of the second temperature Tg may be greater than 1100° C.

In addition, the second time period tg may be 1 hour or more. Even if the second time period tg is increased to 20 hours or more, the extent of growth of the oxygen precipitate nuclei may not be large. Therefore, the second time period tg may be in the range from 1 hour to 20 hours, for example, from 1 hour to 16 hours; however, the disclosure is not limited thereto.

In addition, step 120 may be performed until the oxygen precipitates of the wafer have an observable size. That is, the second time period tg may be the time period taken until the oxygen precipitates of the wafer reach an observable size.

As described above, through step 110 and step 120, the wafer is thermally treated at mutually different temperatures, whereby the oxygen precipitation index, for example, the generation rate of the oxygen precipitate nuclei (a nucleation rate) (or variation in the amount of oxygen precipitation), may be induced for each defect region.

Hereinafter, the heat treatment of the wafer will be described as including both step 110 and step 120; however, the disclosure is not limited thereto.

After step 120, the oxygen precipitation index of the thermally treated wafer is measured (step 130).

According to the embodiment, the oxygen precipitation index that is measured in step 130 may include at least one of a change in the amount of oxygen ΔOi, which is expressed as shown in the following Equation 1 based on the first amount of oxygen included in the wafer before the performance of step 110 and the second amount of oxygen included in the wafer after the performance of step 120, the density of the oxygen precipitates, the generated amount of oxygen precipitate nuclei, or the generation rate of the oxygen precipitate nuclei.

Equation 1

$$\Delta O_i = |O2 - O1|$$ [Equation 1]

Here, O2 represents the second amount of oxygen, and O1 represents the first amount of oxygen.

For example, the density of the oxygen precipitates may be measured as the oxygen precipitation index through a laser scattering method (Laser-Scattering Tomographic Defect (LSTD)) and an etching method.

In addition, step 130 may be performed in the radial direction of the wafer; however, the disclosure is not limited thereto.

After step 130, a characteristic temperature TC, at which the oxygen precipitation index is maximized, is determined (S140). For example, if the oxygen precipitation index is the generated amount of oxygen precipitate nuclei, the characteristic temperature that is determined in step 140 may correspond to the temperature at which the oxygen precipitate nuclei are maximally generated within the first temperature range.

Described in detail, in step 110, a change in the amount of oxygen ΔOi or/and the density of the oxygen precipitates may be marked (plotted) within the first temperature Tn range for generating the oxygen precipitate nuclei, and a first temperature Tn within the first temperature Tn range, at which a change in the amount of oxygen or/and the density of the oxygen precipitates is maximized, may be determined to be the characteristic temperature TC through any of various mathematical methods.

When the characteristic temperature TC cannot be determined within the first temperature Tn range, that is, when the oxygen precipitation index, such as a change in the amount of oxygen or/and the density of the oxygen precipitates, cannot be clearly determined under certain restricted conditions, the characteristic temperature TC may alternatively be determined using a least-square fitting method.

After step 140, the type of defect region included in the wafer may be distinguished based on the characteristic temperature TC determined in step 140 (step 150). That is, referring to the above Table 1, it is possible to distinguish the type of defect region based on the determined characteristic temperature TC.

The relationships between the defect regions, which are distinguished by the characteristic temperature TC determined in step 140 and metal diffusion are identified, observed, and then the characteristic temperatures TC are matched to the respective defect regions corresponding thereto so that the characteristic temperatures TC representing the respective defect regions may be categorized as shown in the above Table 1.

For example, when the characteristic temperature TC is 870° C. or more, the defect region of the wafer may be determined to be a small void region, and when the characteristic temperature TC is 840° C. or more and less than 870° C., the defect region of the wafer may be determined to be an O-band region.

In addition, when the characteristic temperature TC is 810° C. or more and less than 840° C., the defect region may be determined to be a VDP region, and when the characteristic temperature TC is 800° C. or more and less than 810° C., the defect region may be determined to be a transient region.

In addition, when the characteristic temperature TC is less than 800° C., the defect region may be determined to be an IDP region.

Hereinafter, a concrete experimental example will be described for better understanding of the wafer and the wafer defect analysis method according to the embodiment.

Figure 4A:
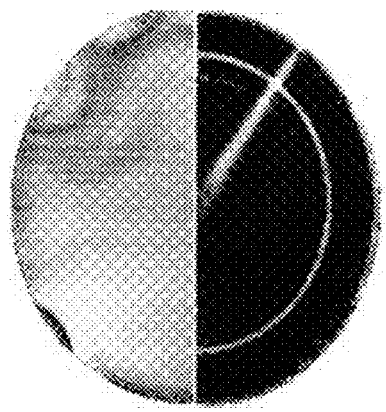
FIGS. 4A and 4B show different types of wafers.
Figure 4B:
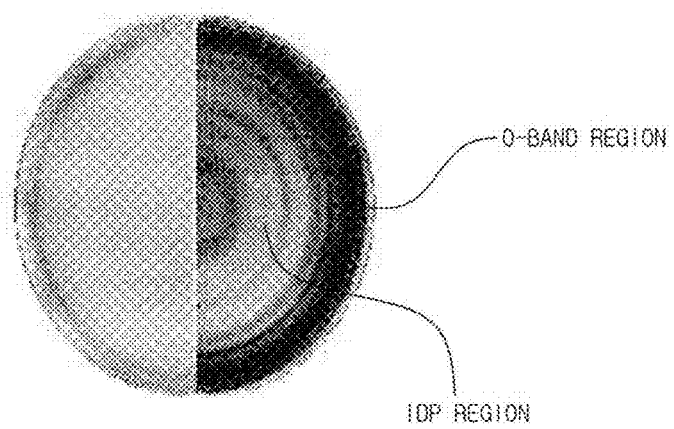

FIGS. 4A and 4B show different types of wafers. FIG. 4A shows a VDP region of a wafer, which has an oxygen concentration Oi, higher than that of the wafer in FIG. 4B, and FIG. 4B shows all of an IDP region, a VDP region and an O-band region of a wafer, which has an oxygen concentration Oi, lower than that of the wafer in FIG. 4A.

As shown in FIGS. 4A and 4B, different types of wafers, which are contaminated with copper (Cu) and are imparted with different oxygen concentrations and defect regions from each other through diffusion, are prepared.

Subsequently, step 110 is performed such that the wafers are primarily thermally treated at the first temperature Tn, ranging from 600° C. to 900° C., for the first time period to of hours, to thereby generate oxygen precipitate nuclei. Subsequently, step 120 is performed such that the wafers are secondarily thermally treated at the second temperature Tg of 1000° C. for the second time period tg of 16 hours, to thereby grow the generated oxygen precipitate nuclei.

Figure 5:
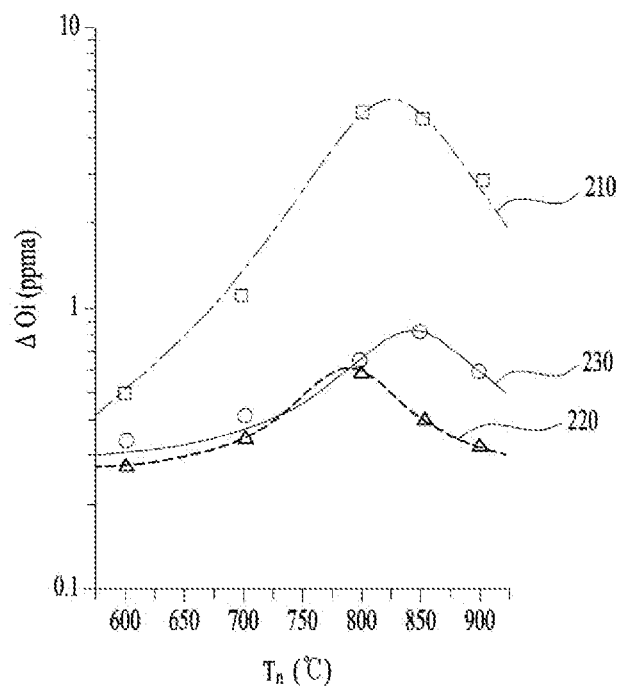
FIG. 5 is a graph showing a change in the amount of oxygen within a first temperature range.
Figure 6:
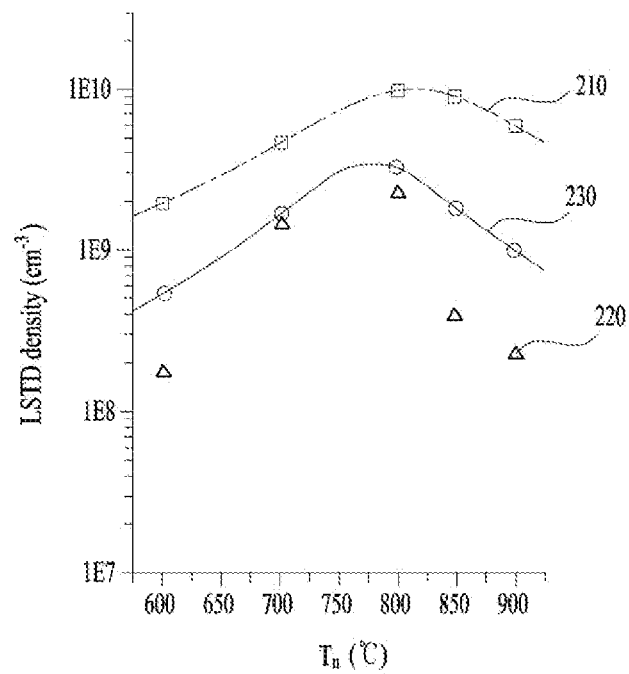
FIG. 6 is a graph showing the density of oxygen precipitates within the first temperature range.

FIG. 5 is a graph showing a change in the amount of oxygen ΔOi within the first temperature Tn range, and FIG. 6 is a graph showing the density of the oxygen precipitates (the LSTD density) within the first temperature Tn range. In FIGS. 5 and 6, reference numeral 210 indicates the VDP region, reference numeral 220 indicates the IDP region, and reference numeral 230 indicates the O-band region.

Subsequently, while the wafers are primarily thermally treated in the first temperature Tn range, a change in the amount of oxygen ΔOi within the first temperature Tn range is measured as shown in FIG. 5, and the density of the oxygen precipitates within the first temperature Tn range is measured as shown in FIG. 6 (step 130).

Subsequently, as shown in FIG. 5, a temperature within the first temperature Tn range, at which a change in the amount of oxygen ΔOi is maximized, is determined to be the characteristic temperature TC, and as shown in FIG. 6, a temperature within the first temperature Tn range, at which the density of the oxygen precipitates is maximized, is determined to be the characteristic temperature (step 140).

For example, referring to FIG. 5, the characteristic temperature TC of the VDP region 210 is 826.6° C., the characteristic temperature TC of the IDP region 220 is 790.3° C., and the characteristic temperature TC of the O-band region is 843.8° C.

In addition, referring to FIG. 6, the characteristic temperature TC of the VDP region 210 is 813.3° C. and the characteristic temperature TC of the O-band region 230 is 778.6° C., whereas the characteristic temperature TC of the IDP region 220 cannot be determined. As such, when the characteristic temperature TC cannot be determined, it is possible to determine the characteristic temperature TC using a mathematical tool such as a least-square fitting method or the like. At this time, it may be assumed that a Lorenz function is used; however, the disclosure is not limited to any particular mathematical function.

A comparison between a change in the amount of oxygen ΔOi within the first temperature Tn range shown in FIG. 5 and the density of the oxygen precipitates within the first temperature Tn range shown in FIG. 6 will be described below.

It is possible to determine the respective characteristic temperatures TC of the VDP region 210, the IDP region 220 and the O-band region 230 through a least-square fitting process using a change in the amount of oxygen ΔOi shown in FIG. 5.

However, when the density of the oxygen precipitates shown in FIG. 6 is used, the fitting process cannot be performed with respect to the IDP region 220, and it is observed that the other defect regions, i.e. the VDP region 210 and the O-band region 230, have slightly low characteristic temperatures TC.

Figure 7A:
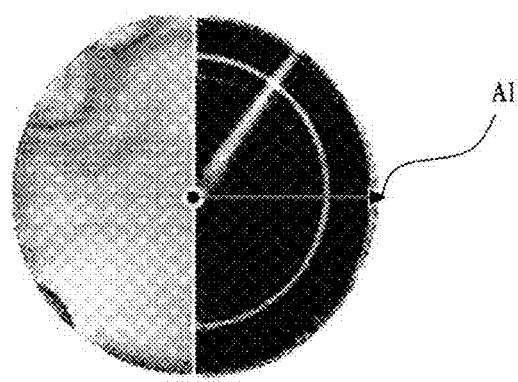
FIG. 7A shows the wafer shown in FIG. 4A.
Figure 7B:
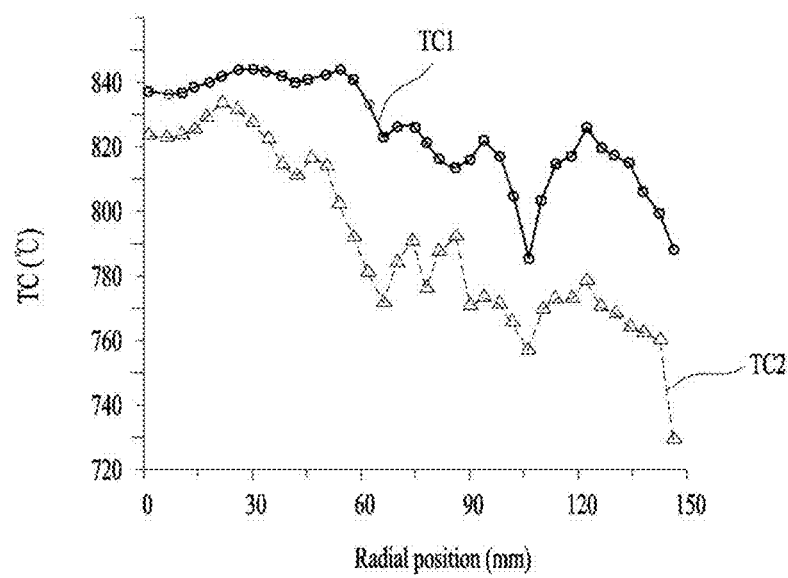
FIG. 7B shows characteristic temperatures in accordance with a radial position of the wafer shown in FIG. 7A.

FIG. 7A shows the wafer shown in FIG. 4A, and FIG. 7B shows the characteristic temperatures TC1 and TC2 in accordance with the radial position of the wafer shown in FIG. 7A.

Figure 8A:
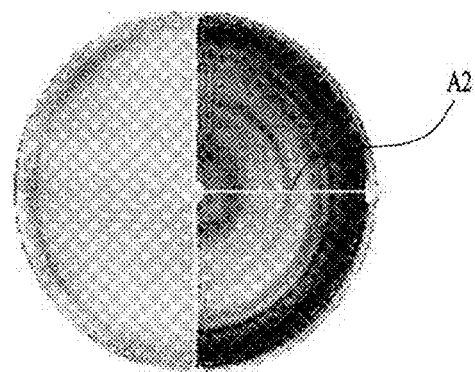
FIG. 8A shows the wafer shown in FIG. 4B.
Figure 8B:
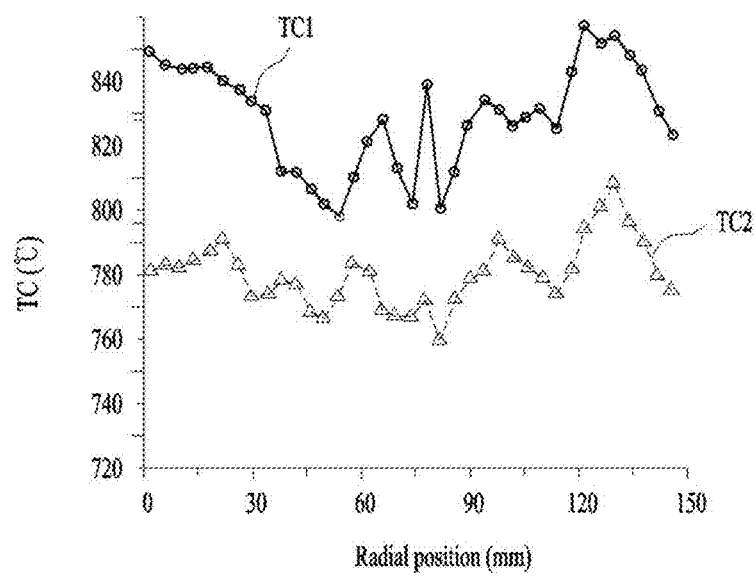
FIG. 8B shows characteristic temperatures in accordance with a radial position of the wafer shown in FIG. 8A.

FIG. 8A shows the wafer shown in FIG. 4B, and FIG. 8B shows the characteristic temperatures TC1 and TC2 in accordance with the radial position of the wafer shown in FIG. 8A.

In each of FIG. 7B and FIG. 8B, the characteristic temperature TC1 is determined using a change in the amount of oxygen ΔOi, and the characteristic temperature TC2 is determined using the density of the oxygen precipitates.

A1 and A2 in FIGS. 7A and 7B denote the directions in which the wafer is inspected, and a radial position indicated by 'O' in FIGS. 7B and 8B is the center of the wafer.

A change in the amount of oxygen ΔOi shown in FIG. 5 refers to a total amount of oxygen consumed during the heat treatment process, and may include all of the information about an amount of oxygen consumed for generating the precipitation nuclei, an amount of oxygen consumed when the oxygen precipitate nuclei are grown, and small-size nuclei that cannot be observed through laser scattering.

Meanwhile, the density of the oxygen precipitates shown in FIG. 6 may include only restricted information that is obtained within the observable range through laser scattering.

In order to further verify this aspect, as shown in FIGS. 7B and 8B, the characteristic temperatures TC1 and TC2 measured in the radial direction of each of the wafers, respectively, shown in FIGS. 7A and 8A were directly compared with each other.

According to the result of the comparison, when the characteristic temperature TC2 is estimated (or determined) using the density of the oxygen precipitates, as shown in FIG. 7B, the characteristic temperature TC2 decreases moving in the radial direction A1 of the wafer shown in FIG. 7A, and as shown in FIG. 8B, the amount of precipitation in the wafer shown in FIG. 8A may decrease due to low oxygen concentration Oi. As such, when it is intended to distinguish the defect region of the wafer in accordance with the characteristic temperature TC2 determined using the density of the oxygen precipitates, side effects may occur besides the defect region.

On the other hand, compared to the case in which the characteristic temperature TC2 is estimated using the density of the oxygen precipitates, when the characteristic temperature TC1 is estimated using a change in the amount of oxygen ΔOi, it is possible to obtain information about the pure defect region without the foregoing side effects. That is, it is known that the characteristic temperature TC1, shown in FIG. 8B, with respect to the edge of the wafer shown in FIG. 8A, which includes the O-band region, is higher than the characteristic temperature TC1, shown in FIG. 7B, with respect to the edge of the wafer shown in FIG. 7A, which includes the VDP region.

As a result, it is possible to distinguish the defect region more consistently when distinguishing the defect region using the characteristic temperature TC1, determined using a change in the amount of oxygen ΔOi, rather than using the characteristic temperature TC2, determined using the density of the oxygen precipitates.

The characteristic temperature TC1 for each defect region shown in the above Table 1 may be obtained as follows.

In the case of the wafer shown in FIG. 7A, as shown in FIG. 7B, a spot located at the radial position of 100 mm may be affected by the IDP region, and the characteristic temperature TC1 derived from this position may be similar to the lowest characteristic temperature TC1 of the wafer shown in FIG. 8A. Using this, the characteristic temperature TC of the VPD region may be determined.

In addition, the characteristic temperature TC of the IDP region may be determined considering that the IDP region identified in the wafer contaminated with copper is relatively shallow.

In addition, the characteristic temperature TC, which is higher than that of the wafer shown in FIG. 7A, is observed in the O-band region that is formed at the edge of the wafer shown in FIG. 8A, and thus the characteristic temperature TC of the O-band region may be determined in consideration thereof.

In addition, although not illustrated, it may also be possible to determine the concentration of point defects included in the wafer in accordance with the characteristic temperature TC determined in step 140. Here, the defect region of the wafer may be defined based on the distribution of point defects in the surface of the wafer.

In general, a wafer includes oxygen atoms that are introduced from a quartz crucible during a crystal growth process, and these oxygen atoms may change into oxygen precipitates through a post-heat process. These oxygen precipitates may act as an element for preventing a device failure, such as leakage current, by gettering metal contamination in the bulk of the wafer. However, because the oxygen precipitates are present in the active area of the device, the oxygen precipitates themselves may act as a cause of device failure. Therefore, the oxygen precipitation phenomenon in the wafer must essentially be considered when manufacturing a high-performance and high-yield integrated device.

The degree of oxygen precipitation in the silicon wafer is closely related to the type and concentration of point defects in the surface of the wafer as well as the amount of oxygen (initial Oi) that is initially present in the wafer. That is, when vacancy defects are present, the degree of oxygen precipitation may increase due to a decrease in the free energy of oxygen precipitates, whereas when self-interstitial defects are present, the degree of oxygen precipitation may decrease.

Even when a wafer does not include a V region, variation in the amount of oxygen in the surface of the wafer is not large, for example, is within 1 ppma, but variation in the distribution of point defects may be large. Accordingly, even when oxygen levels are uniform, variation in the degree of oxygen precipitation in the surface of the wafer may greatly occur. Therefore, in order to guarantee a wafer product having an adequate degree of oxygen precipitation, defect regions are necessarily defined based on the distribution of point defects in the surface.

According to the wafer defect analysis method according to the embodiment, it is possible to distinguish the type of defect region in the wafer using a phenomenon in which, because the degree of generation of oxygen precipitate nuclei for each temperature varies in accordance with the type and concentration of point defects in the wafer, a characteristic temperature TC, at which an oxygen participation index, for example, a generation rate of oxygen precipitate nuclei, is maximized, varies in accordance with the distribution of point defects.

A characteristic temperature of a certain defect region that may be included in a wafer may have the following meaning.

In the aspect of generation of new oxygen precipitate nuclei, driving force necessary for generation of oxygen precipitate nuclei, that is, oxygen supersaturation, needs to be relatively great for a defect region in which precipitation occurs with relative difficulty, and to this end, the first and second temperatures Tn and Tg should be lower.

In the aspect of the stability of the oxygen precipitates that have already been generated, the oxygen precipitates generated in the defect region, in which oxygen precipitation occurs with difficulty, has low thermal stability, and thus there is a high possibility of dissolution of all of the oxygen precipitates during high-temperature heat treatment.

When considering the above-mentioned two aspects, as the characteristic temperature TC is relatively high, oxygen precipitation occurs relatively easily in the defect region, whereas as the characteristic temperature is relatively low, oxygen precipitation occurs with relative difficulty in the defect region. The greater degree of oxygen precipitation actually occurs in the O-band region, the VDP region and the IDP region in that order. Therefore, according to the wafer defect analysis method according to the embodiment, a defect region is distinguished using a characteristic temperature TC.

The wafer defect analysis method according to the above-described embodiment makes it possible to distinguish a defect region in a wafer using a characteristic temperature TC. Therefore, an additional process, such as reactive ion etching (RIE), as well as conventional metal contamination or heat treatment are not necessary, and it is possible to securely distinguish a defect region in a wafer and guarantee a product, thereby improving the reliability of the wafer.

Although embodiments have been described with reference to a number of illustrative embodiments thereof, it should be understood that numerous other modifications and applications may be devised by those skilled in the art that will fall within the intrinsic aspects of the embodiments. For example, various variations and modifications are possible in concrete constituent elements of the embodiments. In addition, it is to be understood that differences relevant to the variations and modifications fall within the spirit and scope of the present disclosure defined in the appended claims.

MODE FOR INVENTION

Various embodiments have been described in the best mode for carrying out the invention.

INDUSTRIAL APPLICABILITY

A wafer and a wafer defect analysis method according to embodiments may be used for manufacturing epi-wafers.

The invention claimed is:

1. A wafer comprising defect regions having respectively different characteristic temperatures at which an oxygen precipitation index is maximized, wherein the defect regions comprise at least one of a small void region, an O-band region, a vacancy dominant defect-free region, a transient region, or an interstitial dominant defect-free region.

2. The wafer according to claim 1, wherein the oxygen precipitation index comprises at least one of a change in an amount of oxygen included in the wafer before and after application of heat treatment to the wafer, a density of oxygen precipitates included in the wafer, a generated amount of oxygen precipitate nuclei, or a generation rate of the oxygen precipitate nuclei.

3. The wafer according to claim 2, wherein, among the defect regions,
a characteristic temperature of the small void region is 870° C. or more,
a characteristic temperature of the O-band region is 840° C. or more and less than 870° C.,
a characteristic temperature of the vacancy dominant defect-free region is 810° C. or more and less than 840° C.,
a characteristic temperature of the transient region is 800° C. or more and less than 810° C., and
a characteristic temperature of the interstitial dominant defect-free region is less than 800° C.

4. The wafer according to claim 1, wherein a void vacancy defect region is absent from the defect regions.

5. The wafer according to claim 2, wherein the oxygen precipitation index corresponds to a value according to a radial direction of the wafer.

6. The wafer according to claim 1, wherein the characteristic temperature corresponds to a value determined using a least-square fitting method.

7. The wafer according to claim 2, wherein, the change in the amount of oxygen includes information about an amount of oxygen consumed for generating the precipitation nuclei.

8. The wafer according to claim 7, wherein the change in the amount of oxygen further includes information about an amount of oxygen consumed when the oxygen precipitate nuclei are grown.

9. The wafer according to claim 8, wherein, the change in an amount of oxygen further includes information about small-size nuclei that cannot be observed through laser scattering.

10. The wafer according to claim 2, wherein the characteristic temperature corresponds to a value estimated using the change in the amount of oxygen.

11. The wafer according to claim 1, wherein the defect regions are defined based on distribution of point defects in a surface of the wafer.

* * * * *